United States Patent
Aleksov et al.

(10) Patent No.: US 10,798,817 B2
(45) Date of Patent: Oct. 6, 2020

(54) METHOD FOR MAKING A FLEXIBLE WEARABLE CIRCUIT

(71) Applicant: Intel Corporation, Santa Clara, CA (US)

(72) Inventors: Aleksandar Aleksov, Chandler, AZ (US); Javier Soto Gonzalez, Chandler, AZ (US); Meizi Jiao, Chandler, AZ (US); Shruti R. Jaywant, San Jose, CA (US); Oscar Ojeda, Chandler, AZ (US); Sashi S. Kandanur, Chandler, AZ (US); Srinivas Venkata Ramanuja Pietambaram, Chandler, AZ (US); Roy Dittler, Chandler, AZ (US); Rajat Goyal, Chandler, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/780,327

(22) PCT Filed: Dec. 11, 2015

(86) PCT No.: PCT/US2015/065257
§ 371 (c)(1),
(2) Date: May 31, 2018

(87) PCT Pub. No.: WO2017/099795
PCT Pub. Date: Jun. 15, 2017

(65) Prior Publication Data
US 2018/0376585 A1 Dec. 27, 2018

(51) Int. Cl.
*H05K 1/02* (2006.01)
*H05K 3/46* (2006.01)
(Continued)

(52) U.S. Cl.
CPC ....... *H05K 1/0283* (2013.01); *H01L 21/4857* (2013.01); *H01L 23/5387* (2013.01);
(Continued)

(58) Field of Classification Search
CPC . H01L 21/6835; H01L 23/4985; H01L 24/81; H01L 21/4857; H01L 23/5383;
(Continued)

(56) References Cited

U.S. PATENT DOCUMENTS 7,265,298 B2 * 9/2007 Maghribi ............. A61N 1/0551
174/254
8,389,862 B2 * 3/2013 Arora .................. H01L 23/4985
174/254
(Continued)

FOREIGN PATENT DOCUMENTS

JP 057057 A 1/1993
JP 2002110717 A 4/2002
(Continued)

OTHER PUBLICATIONS

"International Application Serial No. PCT/US2015/065257, International Search Report dated Aug. 30, 2016", 3 pgs.
(Continued)

*Primary Examiner* — Carl J Arbes
(74) *Attorney, Agent, or Firm* — Schwegman Lundberg & Woessner, P.A.

(57) ABSTRACT

Apparatus and methods are provided for flexible and stretchable circuits. In an example, a method can include forming a first flexible conductor on a substrate, the first flexible conductor including a first conductive trace surrounded on three sides by a first dielectric, and forming a second flexible conductor on top of the first flexible conductor, the first flexible conductor located between the second flexible conductor and the substrate, the second flexible conductor
(Continued)

including a second conductive trace surrounded by a second dielectric.

19 Claims, 7 Drawing Sheets

(51) Int. Cl.
    *H01L 23/538*    (2006.01)
    *H01L 21/48*    (2006.01)
    *H05K 1/11*    (2006.01)
    *H05K 1/18*    (2006.01)
    *H05K 3/06*    (2006.01)
    *H05K 3/30*    (2006.01)
    *H05K 3/40*    (2006.01)
    *H05K 3/28*    (2006.01)

(52) U.S. Cl.
    CPC ............ *H05K 1/115* (2013.01); *H05K 1/189* (2013.01); *H05K 3/064* (2013.01); *H05K 3/303* (2013.01); *H05K 3/4053* (2013.01); *H05K 3/4682* (2013.01); *H01L 23/5383* (2013.01); *H01L 23/5386* (2013.01); *H05K 3/284* (2013.01); *H05K 2201/0133* (2013.01); *H05K 2201/09263* (2013.01); *H05K 2203/043* (2013.01)

(58) Field of Classification Search
    CPC . H01L 23/5386; H01L 23/5387; H05K 1/028; H05K 1/0283; H05K 1/186; H05K 1/115; H05K 3/284; H05K 3/303; H05K 3/4053; H05K 3/4682; H05K 2201/0133; H05K 2201/09263; H05K 2203/043
    See application file for complete search history.

(56) References Cited

U.S. PATENT DOCUMENTS

| | | | |
|---|---|---|---|
| 8,513,532 B2* | 8/2013 | Chen | H01L 23/49816 174/254 |
| 8,624,124 B2* | 1/2014 | Koo | H05K 1/0219 174/117 FF |
| 9,226,402 B2* | 12/2015 | Hsu | H05K 1/189 |
| 9,247,637 B2* | 1/2016 | Hsu | H05K 1/0271 |
| 9,247,648 B2* | 1/2016 | Vanfleteren | H01L 21/565 |
| 9,706,647 B2* | 7/2017 | Hsu | H05K 1/0283 |
| 10,154,583 B1* | 12/2018 | Glickman | H05K 1/0281 |
| 2004/0238819 A1* | 12/2004 | Maghribi | A61N 1/0551 257/57 |
| 2004/0243204 A1* | 12/2004 | Maghribi | A61N 1/05 607/115 |
| 2006/0124351 A1 | 6/2006 | Kusano et al. | |
| 2006/0223236 A1* | 10/2006 | Nomura | H01L 23/4985 438/121 |
| 2012/0051005 A1* | 3/2012 | Vanfleteren | H01L 21/565 361/749 |
| 2012/0275124 A1 | 11/2012 | Pludra et al. | |

FOREIGN PATENT DOCUMENTS

| | | |
|---|---|---|
| TW | 201733423 A | 9/2017 |
| WO | 2010086033 A1 * | 8/2010 |
| WO | 2010086416 A1 * | 8/2010 |

OTHER PUBLICATIONS

"International Application Serial No. PCT/US2015/065257, Written Opinion dated Aug. 30, 2016", 8 pgs.
"Taiwanese Application Serial No. 105134951, Office Action dated Apr. 30, 2020", w English Translation of search report, 16 pgs.

* cited by examiner

METHOD FOR MAKING A FLEXIBLE WEARABLE CIRCUIT

This application is a U.S. National Stage Filing under 35 U.S.C. 371 from International Application No. PCT/US2015/065257, filed Dec. 11, 2015 and published in English as WO 2017/099795 on Jun. 15, 2017, which is incorporated herein by reference in its entirety.

TECHNICAL FIELD

The disclosure herein relates generally to wearable electronics and more particularly to multilayer flexible and stretchable wearable electronics.

BACKGROUND

Electronics and continue to be developed that are smaller yet more powerful computationally and functionally. Opportunities and challenges continue to arise that push the creative enterprise of electronic designers to provide small powerful electronic products that provide desired user functionality in a convenient package. Wearable electronics have been developed yet have failed to capture widespread use because they are physically rigid, bulky, or lack computational or functional capabilities.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
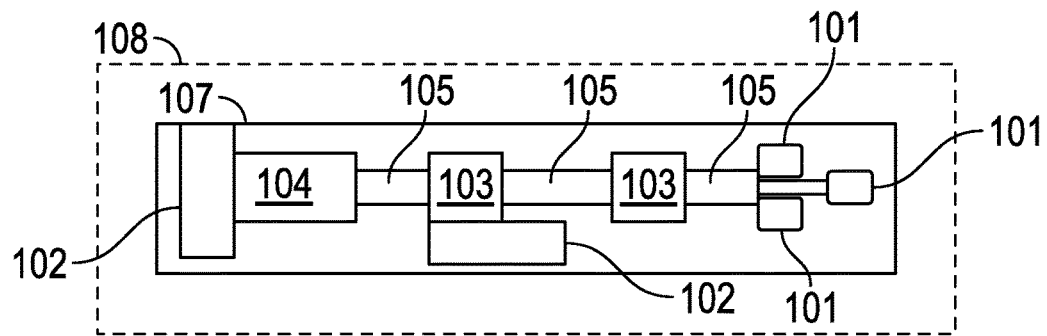
FIG. 1 illustrates generally a block diagram of an example multi-layer, flexible and stretchable, wearable, electronic circuit.

FIG. 1 illustrates generally a block diagram of an example multi-layer, flexible and stretchable, wearable, electronic circuit 100. In certain examples, the electronic circuit 100 can include one or more input/output (I/O) devices 101, one or more connectors 102, device areas 103, an optional power source 104 and one or more flexible and stretchable interconnects 105 for making connections between the other various components. In certain examples, the one or more input/output (I/O) devices 101 can include, but are not limited to, sensors, actuators, displays, inputs or combinations thereof. In certain examples, the sensors, actuator, displays and input devices can include a vast domain of devices including, but not limited to, multi-layered devices, displays, keyboards or combinations thereof. In certain examples, one or more connectors can include connectors for other power sources, connectors for interfacing with non-wearable components such as, but not limited to, power supply chargers, data loggers, and connectors for interconnecting one or more second, flexible and stretchable, wearable, electronic circuits. In certain examples, the device areas 103 can include more sophisticated circuitry, including processors, memory, specialized circuits, hybrid circuits, system-in-packages (SIPs), system-on-chips (SOCs), communication components or combination thereof. In some examples, the communication components can include wired or wireless transmitters, receivers, transceivers, or combination thereof. In certain examples, the device areas 103 generally can include non-flexible circuit components coupled to flexible and stretchable circuit routing elements or interconnects 105 as discussed below. In some examples, a device area 103 or a flexible and stretchable interconnect 105 or a device area 103 and a flexible and stretchable interconnect 105 can include multiple flexible and stretchable layers. In certain examples, a flexible and stretchable electronic circuit 107 including multi-layer device areas or multi-layer interconnects can be produced separate from a wearable substrate 108 and can be applied to the wearable substrate 108, for example, after the electronic circuit is assembled and tested. In certain examples, the flexible and stretchable electronic circuit 107 can include an intermediate substrate to allow the flexible and stretchable electronic circuit 107 to be attached to a wearable substrate 108 such as a fabric. In certain examples, the flexible and stretchable electronic circuit 107 can be attached to a living subject, such as the skin of a person or animal or a flexible membrane of a machine or tool.

Figure 2A:
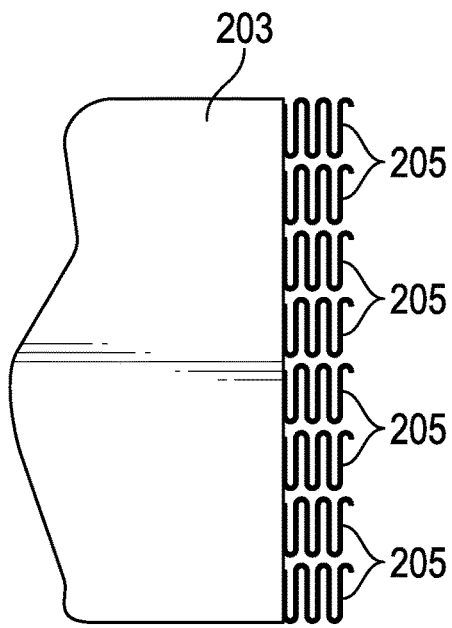
FIGS. 2A and 2B illustrates generally space saving aspects of a multi-layer flexible circuit.
Figure 2B:
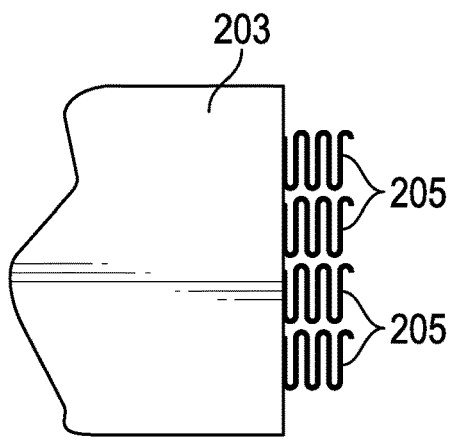

FIGS. 2A and 2B illustrates generally space saving aspects of a multi-layer flexible circuit. FIGS. 2A and 2B illustrate a device area 203 and eight meandering traces or interconnects 205 extending from the device area 203. FIG. 2A is a single layer format and FIG. 2B is an example multilayer format with two layers of meandering traces 205. Additional space savings can be realized by adding additional layers. In some examples, the multilayer traces 205 of FIG. 2B can have an increase in meandering amplitude which can allow space savings, and circuit traces that can tolerate additional stretching and can provide additional flexibility.

Figure 3:
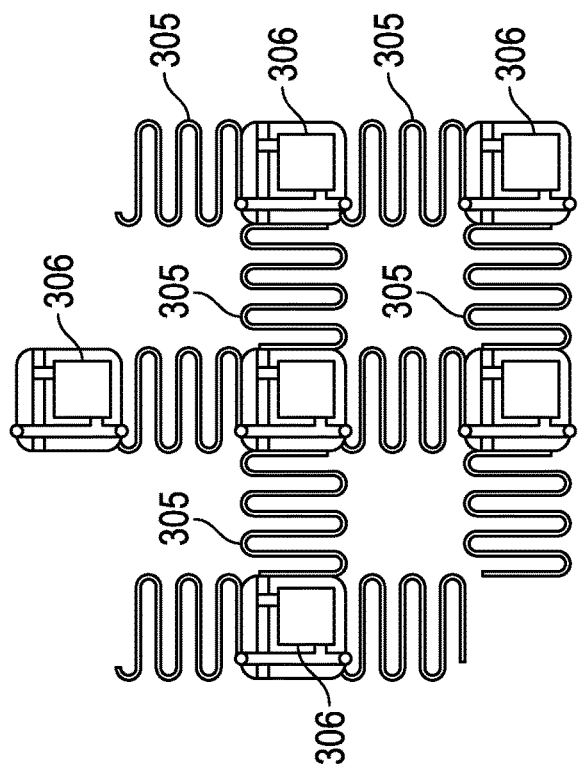
FIG. 3 illustrate generally a portion of an example multi-layer, flexible and stretchable, wearable, electronic circuit 300.

FIG. 3 illustrate generally a portion of an example multi-layer, flexible and stretchable, wearable, electronic circuit 300. The portion includes a matrix of flexible and stretchable conductors 305 that intersect. In certain examples, the flexible and stretchable conductors 305 can be electrically connected at one or more of the matrix intersections 306. In some examples, the flexible and stretchable conductors 305 can be isolated from other conductors at one or more of the matrix intersections 306. Such a matrix structure can be useful for creating a stretchable and flexible display or keyboard devices, for example. Such structures in a single layer format are possible but comparatively can require an extremely large layout to prevent overlapping conductors.

Figure 4:
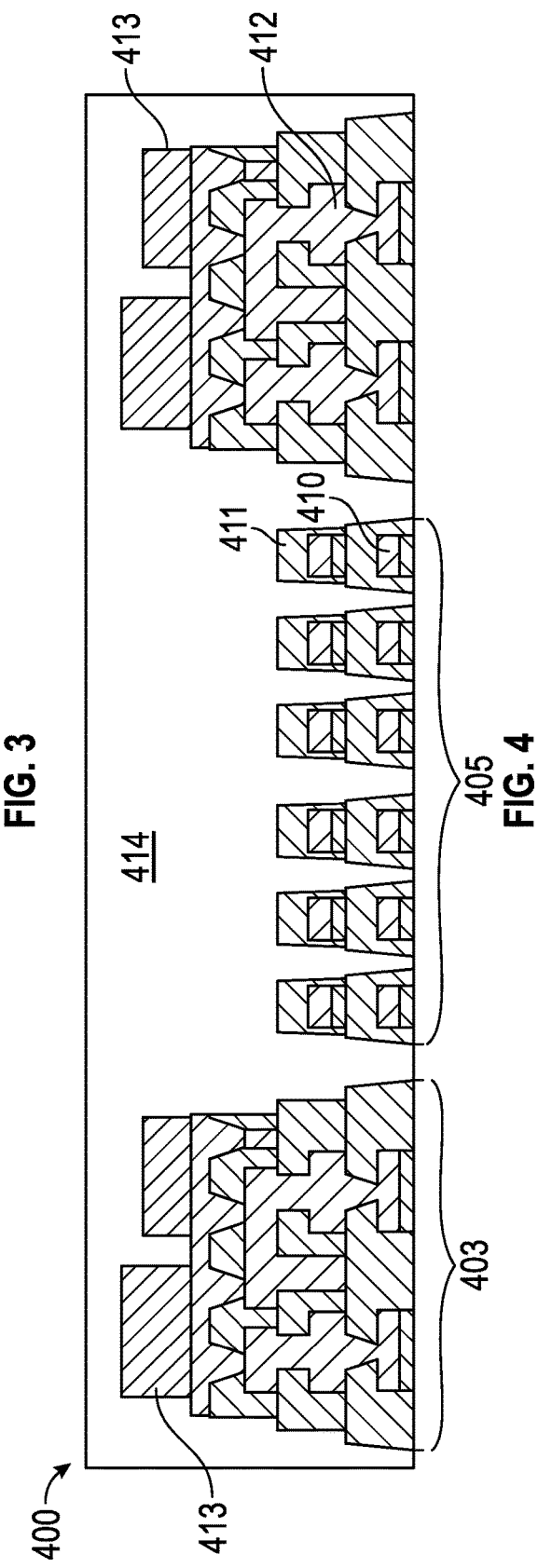
FIG. 4 illustrates a cross section of at least a portion of an example multi-layer, flexible and stretchable, wearable, electronic circuit 400.

FIG. 4 illustrates a cross section of at least a portion of an example multi-layer, flexible and stretchable, wearable, electronic circuit 400. The method for making such a structure is discussed below with reference to FIGS. 5A-5I. In an example, the circuit 400 can include a multiple layer device area 403 and a multiple layer interconnect 405. In some examples, the device area 403 can be single layer. In some examples, the interconnect area 405 can be single layer. In certain examples, each layer of the multiple layer interconnect area 405 can include a conductive material 410 covered with a dielectric 411. Both the device and the interconnect areas 403, 405 can include vias 412 extending through one or more layers to vertically interconnect conductive material. In certain examples, the vias 412 can be used to connect to other devices manufactured separately from the stretchable and flexible electronic circuit 400 such as other devices integrated with a fabric for a wearable garment or another device attached to a user's skin. In some examples, the vias 412 can be used to interconnect layers, or interconnect devices between layers. In some examples, the vias 412 can be used to connect other circuit devices such as other circuit boards, chips 413, processors, memory, etc. IN certain examples, an elastomeric material 414 can cover the device area 403 and the interconnect area 405.

Figure 5A:
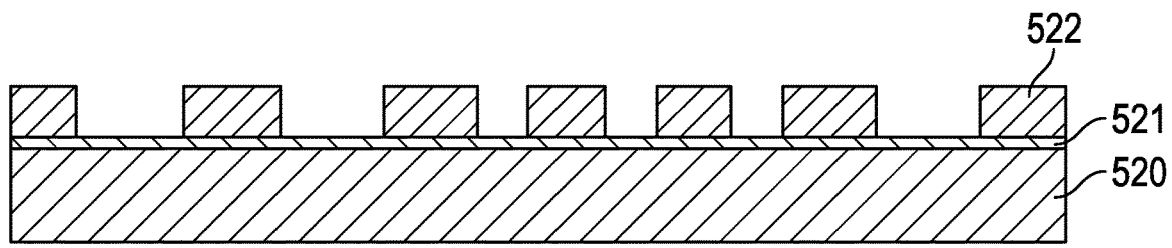
FIGS. 5A-5L illustrate generally an example method of making a multiple layer, flexible, stretchable, electronic circuit.

FIGS. 5A-5L, illustrate generally an example method of making a multiple layer, flexible, stretchable, electronic circuit. In FIG. 5A, a carrier 520, such as a temporary carrier, can be plated with a seed layer 521 of conductive material and then a resist 522 can be applied to the seed layer 521. The resist 522 can be processed to define contacts in the device area 503 or a meandering route, trace, or path for the interconnect area 505.

Figure 5B:
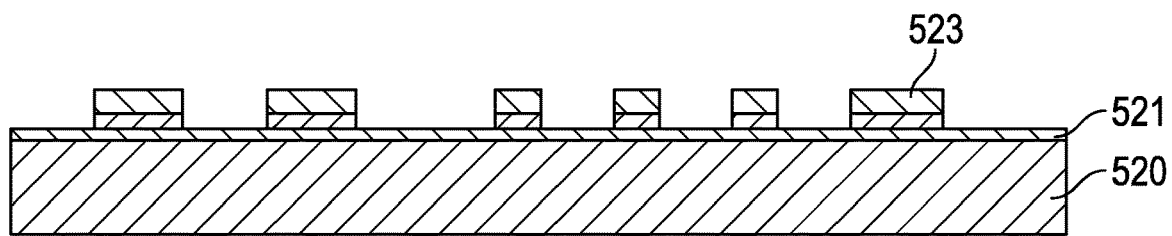
Figure 5C:
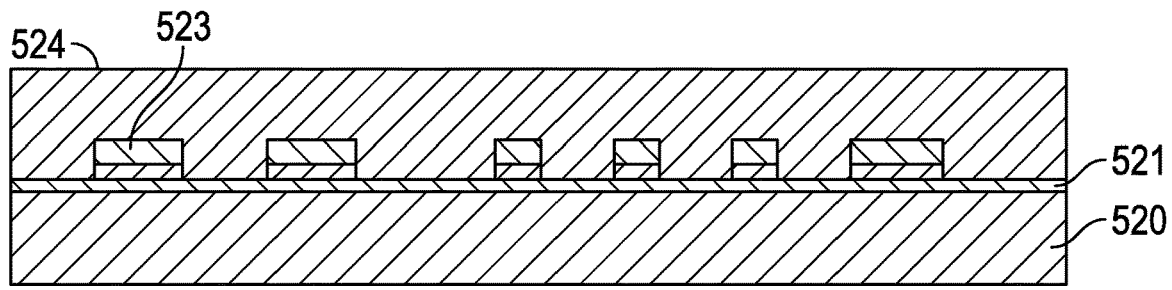
Figure 5D:
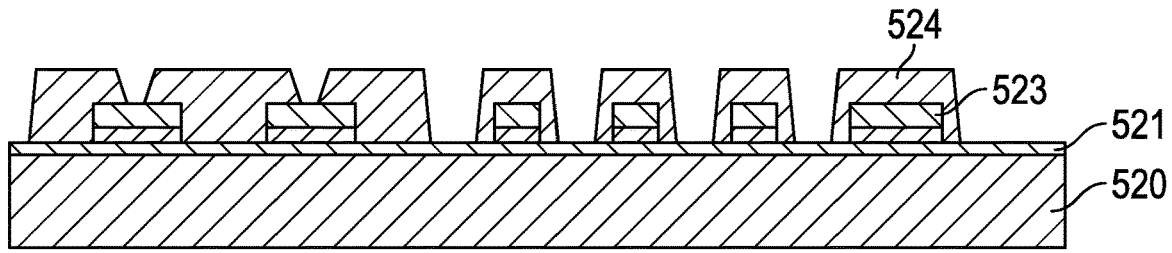
Figure 5E:
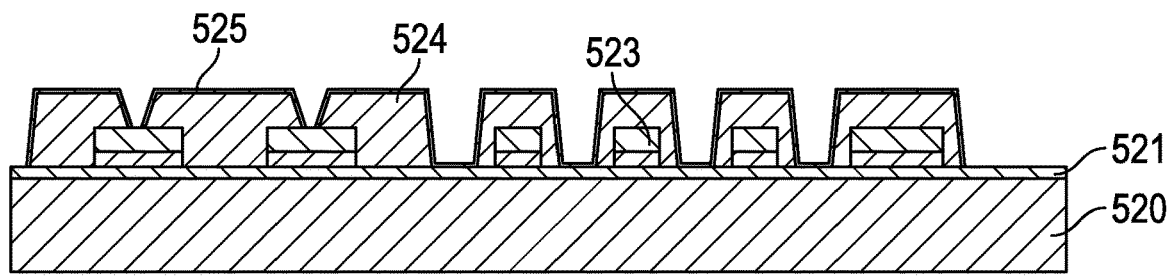

In FIG. 5B, conductive material 523 can be deposited on the seed layer 521 to form device area 503 contacts or meandering conductive interconnects of the interconnect area. In certain examples, the meandering path or pattern of the conductive material can give rise to flexible and stretchable conductors. In certain examples, the meandering path can be similar to a sinusoidal pattern. In certain examples, an amplitude of the repeating pattern can be a factor in defining a stretchable limit to the flexible and stretchable conductor. In certain examples, the conductive material can include, but is not limited to, copper, nickel, aluminum, or combinations thereof. After deposition of the conductive material 523, the resist can be removed. It is noted that the conductive material 523 of FIG. 5B is shown as two layers of materials. In certain examples, the conductive material 523 can include more or less layers of conductive material. In some examples, a single layer of conductive material can include a mixture of multiple materials. In FIG. 5C, a dielectric 524 can be applied to cover the conductive contacts/traces. In certain examples, the dielectric 524 can be laminated to the underlying structures. In certain layers the dielectric can surround at least three sides of the conductive material and the carrier 520 and seed material 521 can enclose the conductive material 523 in cooperation with the dielectric 524. In some examples, the dielectric 524 can be processed to such as by etching to prepare for fabrication of a second layer of the multiple layer, flexible, stretchable, electronic circuit. In some examples, the dielectric can be a photo-imageable dielectric (PID) and can be exposed to remove excess dielectric as shown in FIG. 5D, such as to for vias between the first layer and the second layer. In certain examples, the dielectric 524 can be cured in preparation for fabrication of a second layer of the multiple layer, flexible, stretchable, electronic circuit. In some examples, the dielectric can be treated or de-smeared to prepare the dielectric for additional layers. In some examples, the dielectric surface can cleaned and roughened chemically. Cleaning and roughening of the dielectric surface can remove residue from earlier processes and can enhance adhesion between the dielectric and the material of the next layer. At FIG. 5E, a second seed layer 525 can be applied to the dielectric. In certain examples, the second seed layer 525 can include copper. In some examples, the second seed layer 525 can be deposited using electroless deposition. In some examples, the second seed layer 525 can be applied using sputter deposition.

Figure 5F:
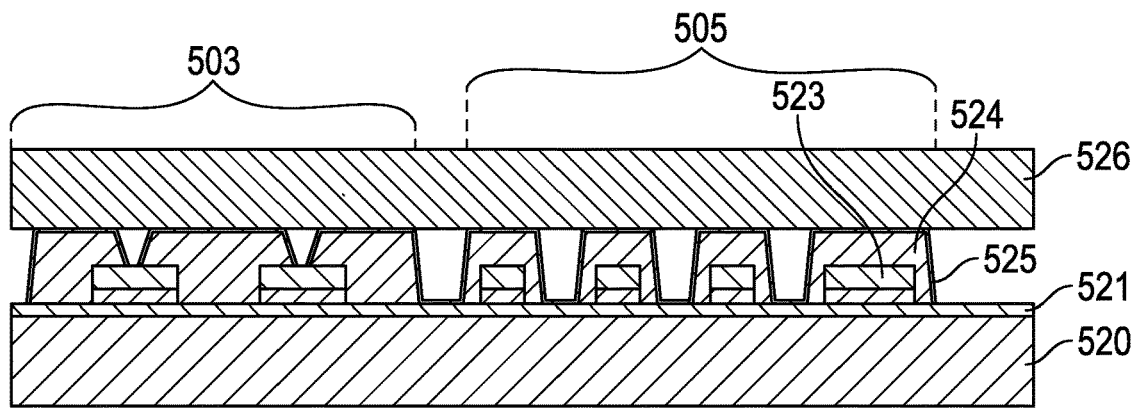
Figure 5G:
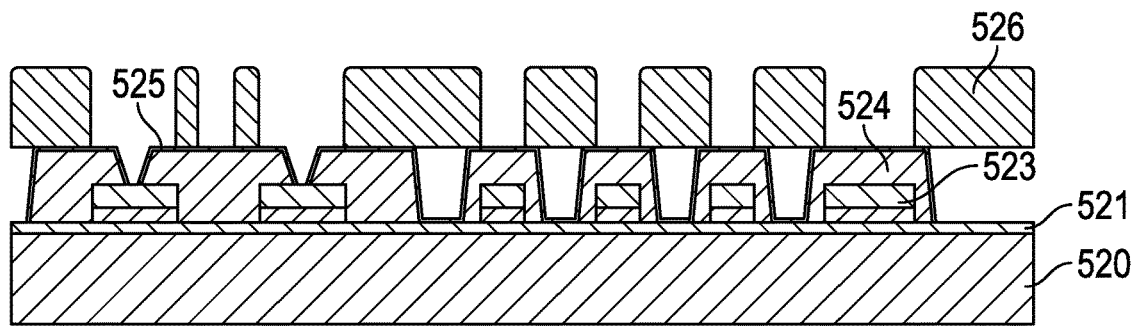
Figure 5H:
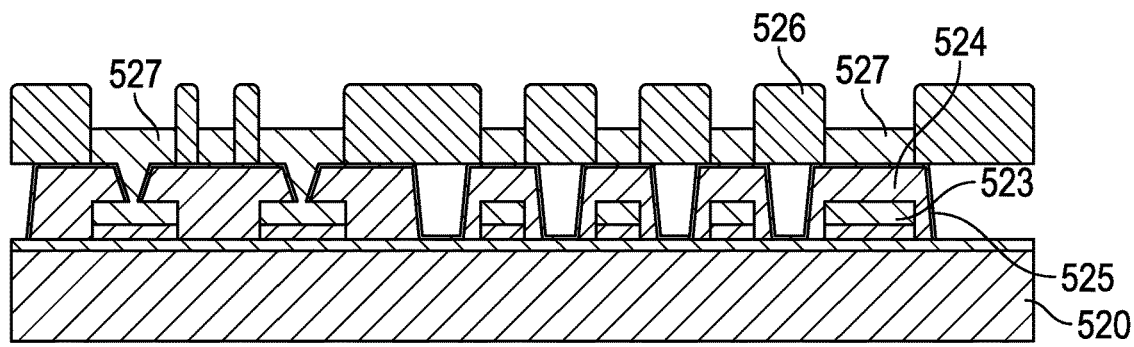
Figure 5I:
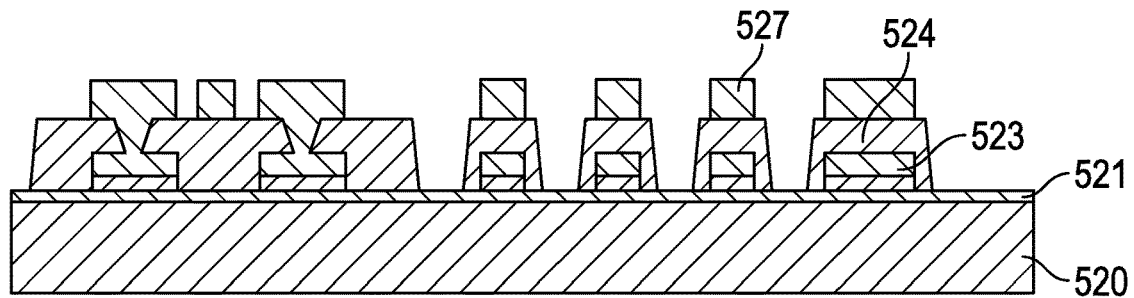

At FIG. 5F, a second resist 526 can be applied to the second seed layer 525. In certain examples, the second resist 526 can be laminated to the underlying structure. At FIG. 5G, the resist 526 can be processed, such as by exposure and development of a PID, to define metal regions of a second layer. It is noted that in the example device of FIG. 5G the traces of the interconnect area 505 are only single layer and the device area 503 is multiple layers. At FIG. 5H, conductive material 527 such a copper is applied to the second seed layer 525 to form the second level contacts in the device area 503 and second level traces in the flexible interconnect area 505. At FIG. 5I, the resist 526 can be removed. In certain examples, the extra material of the second seed layer 525 can be removed. In some examples, the conductive material 527 can be roughened to enhance adhesion of materials that may be placed on top of the conductive material 527.

Figure 5J:
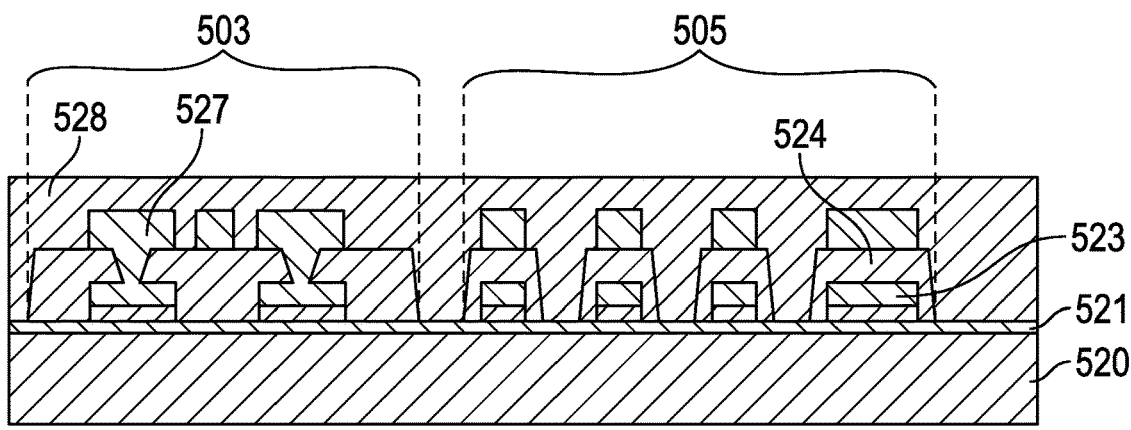

At FIG. 5J, dielectric 528 can be applied to encapsulate the conductive material 527. At FIG. 5K, the dielectric can be patterned to remove excess dielectric and to define vias 529. In certain examples, a seed layer can be applied and the method can continue to add additional layers to the device area 503 as well as additional layers in the interconnect area 505 as describe with reference to FIGS. 5D-5J. It is understood that upon completion, there may be a different number of layers in the device area 503 than there are in the interconnect area 505.

Figure 5K:
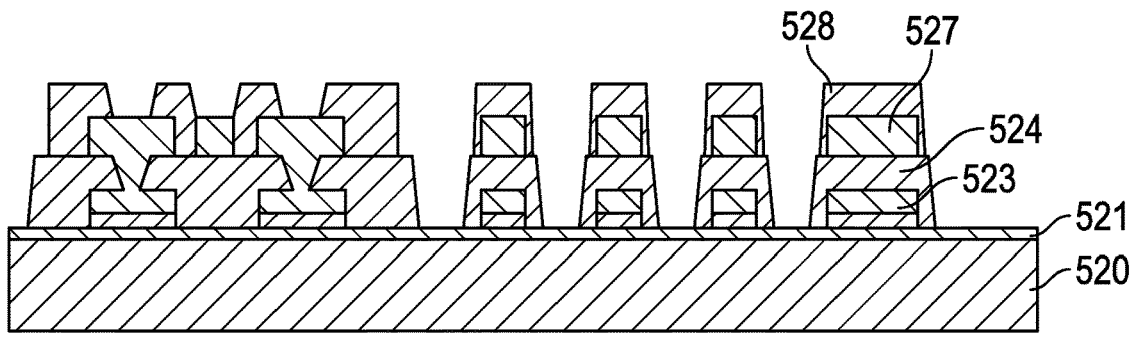
Figure 5L:
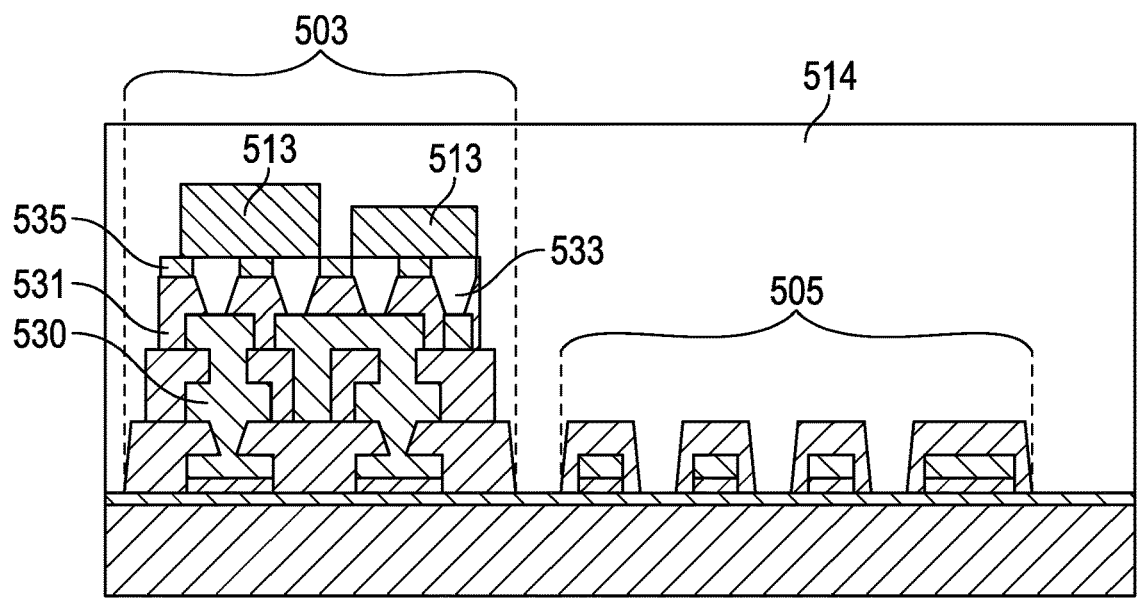

FIG. 5L illustrates the structure of FIG. 5K with an additional conductive layer 530 and a dielectric solder resist 531 attached to the conductive material of the additional layer 530. In certain examples, the dielectric solder resist 531 can be laminated to the underlying structure can be exposed, developed and cured to form vias. Solder 533 can be deposited in the vias and components 513 can be attached to the solder 533. In certain examples, upon completion of one or more layers in the device area 503, circuit components 513 such as circuit chips, for example, can be physically and electrically coupled to one or more contacts in the device area 503. In some examples, nonconductive underfill material 535 can be added. Non-conductive underfill material 535 can be added to fill the space between the dielectric material 531 and the components 513 attached to the stretchable package in the areas outside of the electrical interconnects 533.

When all layers of the device area 503 and the interconnect area 505 are complete, an elastomer 514 can be applied to cover the device area 503 and the interconnect area 505. In certain examples, the elastomer 514 can be applied to cover the entire flexible and stretchable circuit. In certain examples, the carrier 520 or sacrificial layer can be removed. In some examples, excess portions of the original seed layer 521 can be removed. In certain examples, an adhesive layer can be applied in place of the carrier 520. The adhesive for the adhesive later can be chosen to conform to application of the circuit to fabric, such as fabric of an article of clothing. In certain examples, an adhesive layer can be chosen to allow the circuit to be attached to the skin of a user. In some examples, the adhesive layer can include a peelable layer to protect the adhesive prior to application.

Figure 6:
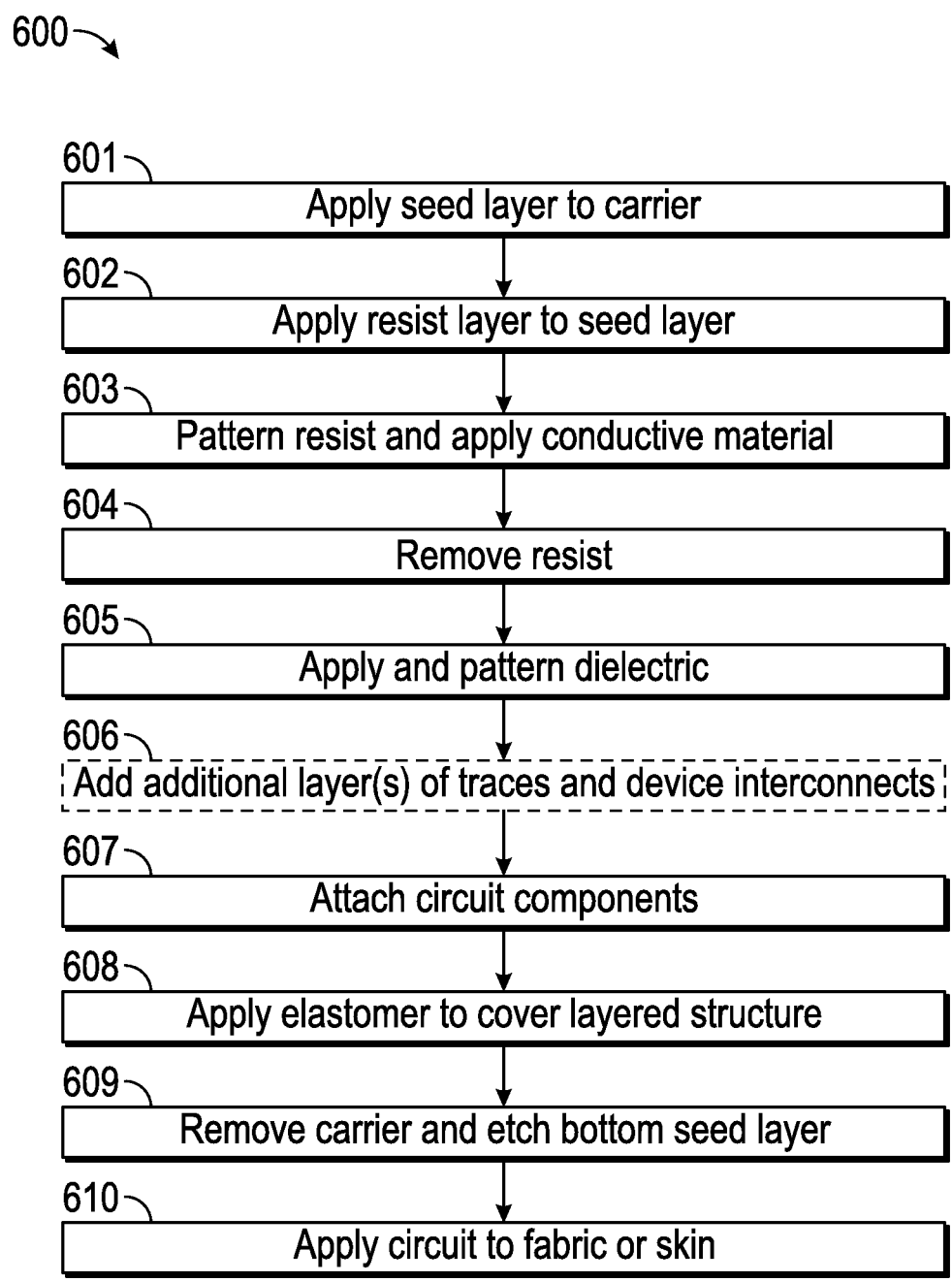
FIG. 6 illustrates generally an example method of making stretchable and flexible multi-layer circuits.

FIG. 6 illustrates generally an example method of making stretchable and flexible multi-layer circuits. At 601, a seed layer can be applied to a carrier layer. At 602, a resist can be applied to the seed layer. At 603, the resist can be patterned and conductive material can be layered atop the exposed seed layer. In some examples, the patterning can include patterning meandering traces through the resist. Upon application of the conductive material the traces can flex and stretch without breaking electrical continuity. In some examples, the resist can include a photo-imageable resist. In certain examples, the conductive material can include, but is not limited to, copper, nickel, aluminum, gold, silver, tin, or combinations thereof.

At 604, the resist can be removed. At 605, a dielectric can be applied to cover the exposed portions of the seed layer and the conductive material and the dielectric can be patterned. In certain examples, the dielectric can include a photo-imageable dielectric. In certain examples, the dielectric can be patterned to form vias to interconnect layers of conductive material. If additional layers of meandering traces and device interconnects are desired, at 606, a new seed layer can be applied to the dielectric to begin the new layer and the method can repeat with the application of the resist and so on. Upon completing the last desired layer, the top of the structure can include a layer of patterned dielectric.

At 607, circuit components can be attached. In certain examples, attaching the circuit components can include filing interconnect vias with solder and attaching the components using the solder. In some examples, underfill material can be applied to the dielectric to better adapt the mounting surface for the components. At 608, an elastomer can be applied to cover the layered circuit structure and the layered interconnect area. In some examples, the application of the elastomer can include molding the elastomer to cover the layered circuit. In certain examples, extra material such as extra material from the first seed layer can be removed prior to applying the elastomer. At 609, the carrier layer can be removed and the bottom seed layer etched to remove excess seed layer material. In some examples, upon etching the bottom-side seed layer, additional layers can be added for bottom-side encasement and for final product adhesion. At 610, the stretchable and flexible circuit can be applied to a fabric or the skin of a user. In some examples, the entire structure can include multiple individual circuits and the method can include singulating the circuits.

Figure 7:
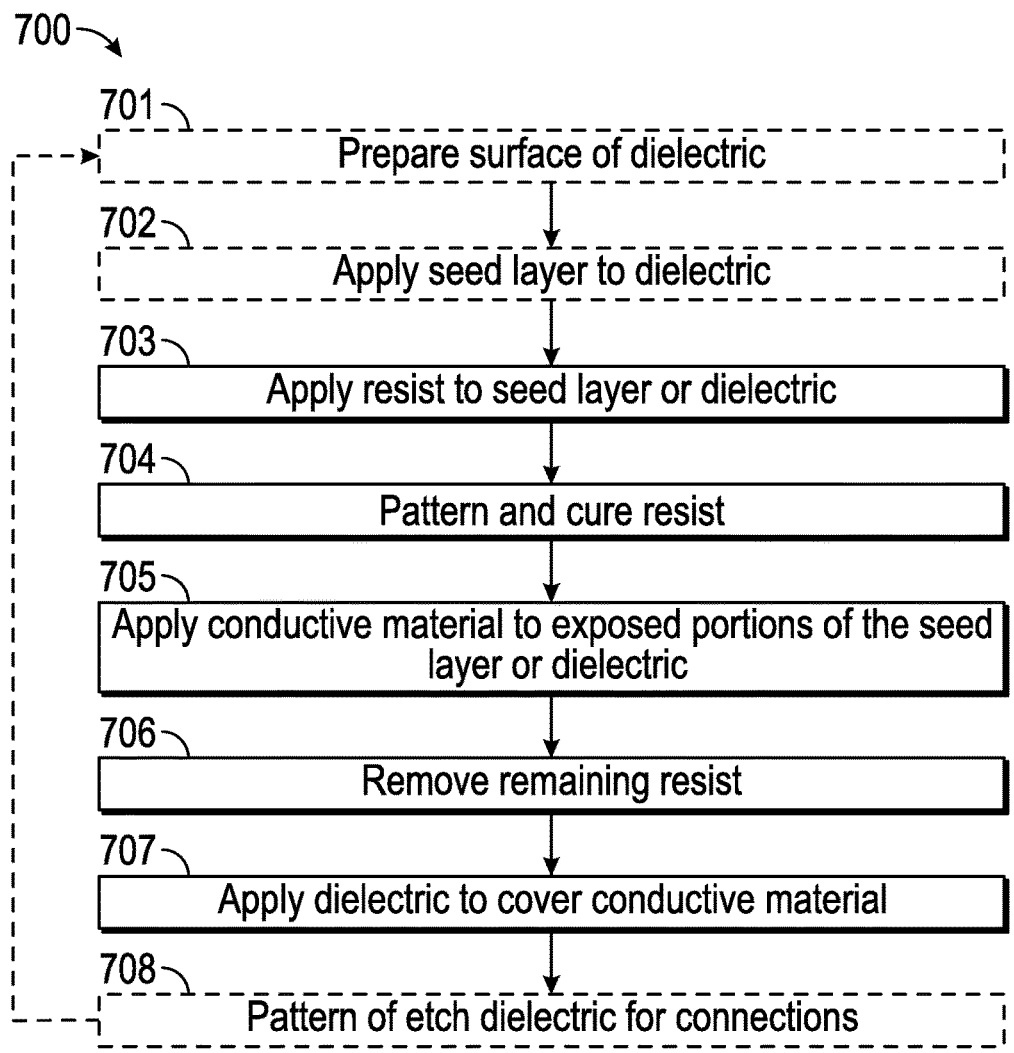
FIG. 7 illustrates generally a flowchart of an example method of adding additional layers of meandering traces above a first layer of meandering traces.

FIG. 7 illustrates generally a flowchart of an example method of adding additional layers of meandering traces above a first layer of meandering traces. The method assumes that a layer of dielectric has be applied to cover the first layer of meandering traces. The dielectric can be patterned such as shown in FIG. 5D. At 701, surfaces of the dielectric can optionally be prepared to assist adhesion of a seed layer or the conductive material of the trace or traces. Such preparation can include roughening the surface. At 702, a seed layer can optionally be applied to the dielectric. At 703, a resist can be applied to the dielectric or the seed layer. In some examples, the resist can be laminated to the dielectric or the seed layer. At 704, the resist is patterned and cured to create forms for the meandering traces. At 705, conductive material can be applied to the seed layer. In some examples, exposed portions of the dielectric or the seed layer can be plated with conductive material to form the meandering traces of the new layer. In certain examples, applying the conductive material can include depositing the conductive material. At 706, the remaining resist can be removed. At 707, dielectric can be applied to cover the new layer of conductive meandering traces. In some examples, one or more surfaces of the conductive material can be prepared, such as by roughening, to better accommodate adhesion of the dielectric. In some examples, extra seed layer material can be removed after removal of the resist. In certain examples, the dielectric can be etched to remove excess material. In some examples, at 708, the dielectric can optionally be patterned or etched to allow for connections, such as by vias, to underlying conductive material. The method 700 can be repeated to add additional layers of meandering traces as desired. In certain examples, the method can be adapted to add additional device area layers. Such adaption can include etching or patterning the dielectric to form vias for vertical interconnections and then repeating the method for additional layers.

Figure 8:
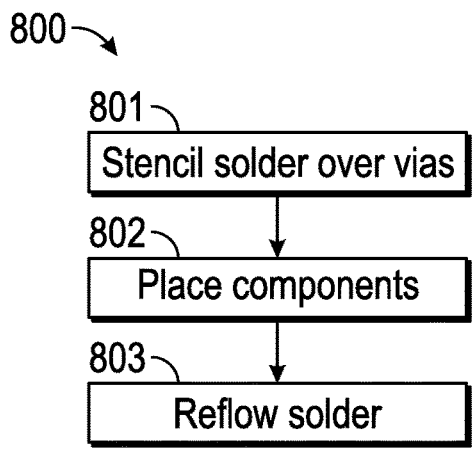
FIG. 8 illustrates generally a flowchart of an example method for attaching components to a layered device area such as the device area 503 shown in FIG. 5K, for example.

FIG. 8 illustrates generally a flowchart of an example method for attaching components to a layered device area such as the device area 503 shown in FIG. 5K, for example. The method can include, at 801, stencil printing solder over the vias. At 802, placing the components with component terminals properly placed on corresponding solder connections. At 803, reflowing the solder to electrically connect the component to the underlying circuit connections and meandering traces. In some examples, underfill material can be applied to fill any gaps beneath the components. In certain examples, an optional water cleaning can complete the method 800.

Notes and Additional Examples

In Example 1, a method for snaking a flexible and stretchable, wearable circuit can include forming a first flexible conductor on a substrate, the first flexible conductor including a first conductive trace and a first dielectric, and forming a second flexible conductor on top of the first flexible conductor, the first flexible conductor located between the second flexible conductor and the substrate, the second flexible conductor including a second conductive trace and a second dielectric.

In Example 2, forming the first flexible conductor and forming the second flexible conductor of Example 1 optionally includes forming each flexible conductor with a meandering, repeating pattern having an amplitude, wherein the flexible wearable circuit is configured to stretch; and wherein a stretch limit of each of the flexible conductors is a function of the amplitude.

In Example 3, the forming the first flexible conductor of any one or more of Examples 1-2 optionally includes attaching a first resist layer to the substrate, the first resist layer defining the meandering path of the first flexible conductor.

In Example 4, the forming the first flexible conductor of any one or more of Examples 1-3 optionally includes forming the first conductive trace using the meandering path defined by the resist layer.

In Example 5, the forming the first flexible conductor of any one or more of Examples 1-4 optionally includes removing the resist layer.

In Example 6, the forming the first flexible conductor of any one or more of Examples 1-5 optionally includes covering the first conductive trace with a first dielectric layer.

In Example 7, the covering the first conductive trace of any one or more of Examples 1-6 optionally includes laminating the first conductive trace with a dielectric layer.

In Example 8, the covering the first conductive trace of any one or more of Examples 1-7 optionally includes laminating the first conductive trace with a photo imageable dielectric (ND) layer.

In Example 9, the forming the second flexible conductor of any one or more of Examples 1-8 optionally includes applying a seed layer upon the dielectric.

In Example 10, the forming the second flexible conductor of any one or more of Examples 1-9 optionally includes applying a resist layer on the seed layer.

In Example 11, the forming the second flexible conductor of any one or more of Examples 1-10 optionally includes exposing the resist layer to define the meandering path of the second flexible conductor.

In Example 12, the forming the second flexible conductor of any one or more of Examples 1-11 optionally includes plating exposed portions of the seed layer with a conductive material to provide the second conductive trace.

In Example 13, the the forming the first flexible conductor of any one or more of Examples 1-12 optionally includes covering the first conductive trace with a second dielectric layer.

In Example 14, the method of any one or more of Examples 1-13 optionally includes covering the second dielectric layer with an elastomer.

In Example 15, the forming the first conductive layer of any one or more of Examples 1-14 optionally includes forming a first layer of a device area at a location along the meandering path of the first flexible conductive.

In Example 16, the forming the second conductive layer of any one or more of Examples 1-15 optionally includes forming a second layer of the device area, and covering the second layer of the device with the second dielectric layer.

In Example 17, the method of any one or more of Examples 1-16 optionally includes attaching a circuit chip to the first and second layers of the device area.

In Example 18, the method of any one or more of Examples 1-17 optionally includes covering the second dielectric layer and the circuit chip with an elastomer.

In Example 19, the attaching the circuit chip of any one or more of Examples 1-18 optionally includes exposing and developing device contact vias within the second dielectric layer.

In Example 20, a circuit configured to be worn by a user can include a multiple layer interconnect area configured to couple two or more devices of the circuit, wherein the multiple layer interconnect area can include a first material configured to attached the circuit to a fabric or skin, a first flexible conductor adjacent the first material, the first flexible conductor including a first conductive trace surrounded on three sides by a first dielectric, a second flexible conductor adjacent the first flexible conductor, the first flexible conductor located between the second flexible conductor and the first material, the second flexible conductor including a second conductive trace surrounded by a second dielectric, and an elastomer covering the first flexible conductor and the second flexible conductor.

In Example 21, at least one of the first dielectric or the second dielectric of any one or more of Examples 1-20 optionally includes is a photo-imageable dielectric.

In Example 22, the circuit of any one or more of Examples 1-21 optionally includes a device area including the first material, the elastomer and one device of the two or more devices. The device area can include a first connection material electrically coupled to the first flexible conductor, and a second connection material separated from the first connection material by a third dielectric, the first connection material positioned between the first material and the second connection material.

In Example 23, the circuit of any one or more of Examples 1-22 optionally includes a fourth dielectric, wherein the second connection material is located between the third dielectric and the fourth dielectric.

In Example 24, the circuit of any one or more of Examples 1-20 optionally includes a via through the fourth dielectric, and a solder connection extending through the via, the solder connection electrically coupled to a terminal of the one device and to the second connection material.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "of" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method for making a flexible, wearable circuit, the method comprising:
   forming a first flexible conductor, the first flexible conductor including a first conductive trace and a first dielectric; and
   forming a second flexible conductor on top of the first flexible conductor, the first flexible conductor located between the second flexible conductor and a first conductive seed layer, the second flexible conductor including a second conductive trace and a second dielectric;
   wherein forming the first flexible conductor includes depositing the conductive seed layer on a temporary substrate.

2. The method of claim 1, wherein forming the first flexible conductor includes attaching a first resist layer to the first conductive seed layer, the first resist layer defining a meandering path of the first flexible conductor.

3. The method of claim 2, wherein forming the first flexible conductor includes forming the first conductive trace using the meandering path defined by the first resist layer.

4. The method of claim 3, wherein forming the first flexible conductor includes removing the first resist layer.

5. The method of claim 4, wherein the forming the first flexible conductor includes covering the first conductive trace with a first dielectric layer.

6. The method of claim 4, wherein covering the first conductive trace includes laminating the first conductive trace with a dielectric layer.

7. The method of claim 4, wherein covering the first conductive trace includes laminating the first conductive trace with a photo imagable dielectric (PID) layer.

8. The method of claim 5, wherein forming the second flexible conductor includes applying a second conductive seed layer upon the first dielectric layer.

9. The method of claim 8, wherein forming the second flexible conductor includes applying a second resist layer on the second conductive seed layer.

10. The method of claim 9, wherein forming the second flexible conductor includes exposing the second resist layer to define a meandering path of the second flexible conductor.

11. The method of claim 10, wherein forming the second flexible conductor includes:
    plating exposed portions of the second conductive seed layer with a conductive material to provide the second conductive trace;
    removing remaining portions of the second resist layer; and
    removing remaining exposed portions of the second conductive seed layer.

12. The method of claim 11, wherein the forming the first flexible conductor includes covering the first conductive trace with a second dielectric layer.

13. The method of claim 12, including covering the second dielectric layer with an elastomer.

14. The method of claim 12, wherein forming the first conductive trace includes forming a first layer of a device area at a location along the meandering path of the first flexible conductor.

15. The method of claim 14, wherein forming the second conductive trace includes forming a second layer of the device area; and
    covering the second layer of the device area with the second dielectric layer.

16. The method of claim 15, including attaching a circuit chip to the first and second layers of the device area.

17. The method of claim 16, including covering the second dielectric layer and the circuit chip with an elastomer.

18. The method of claim 16, wherein attaching the circuit chip includes exposing and developing device contact vias within the second dielectric layer.

19. The method of claim 1, including:
    removing the temporary substrate; and
    removing portions of the first conductive seed layer.

* * * * *